United States Patent [19]

Francis et al.

[11] Patent Number: 4,542,258

[45] Date of Patent: Sep. 17, 1985

[54] BUS BAR INTERCONNECT FOR A SOLAR CELL

[75] Inventors: Robert W. Francis, New York, N.Y.; Joseph D. Napoli, Windham, N.H.; Hsue C. Tsien, Chatham Township, Morris County, N.J.

[73] Assignee: Solarex Corporation, Chicago, Ill.

[21] Appl. No.: 383,221

[22] Filed: May 28, 1982

[51] Int. Cl.⁴ .................... H01L 31/04; H01L 31/18
[52] U.S. Cl. ........................... 136/256; 29/572; 29/589; 29/874
[58] Field of Search ............... 136/244, 256; 29/572, 29/589, 874

[56] References Cited

U.S. PATENT DOCUMENTS

| 3,553,030 | 1/1971 | Lebrun | 136/244 |
| 3,849,880 | 11/1974 | Haynos | 29/626 |
| 4,287,382 | 9/1981 | French | 136/244 |
| 4,301,322 | 11/1981 | Amick | 136/256 |
| 4,312,692 | 1/1982 | Ikeda et al. | 156/272 |
| 4,321,283 | 3/1982 | Patel et al. | 427/74 |

FOREIGN PATENT DOCUMENTS 2295574 8/1976 France ..................... 136/256

Primary Examiner—Aaron Weisstuch
Attorney, Agent, or Firm—Anthony J. Janiuk; William T. McClain; William H. Magidson

[57] ABSTRACT

The present invention includes a method for applying bus bars to a solar cell by one single solder dipping operation. The bus bars are first temporarily spot attached to the pre-metallized surface of a solar cell by means of a high temperature adhesive. The solar cell and bus bars are then solder dipped allowing the solder to flow between the bus bars and solar cell surface by capillary action, adjacent the adhesive.

11 Claims, 6 Drawing Figures

BUS BAR INTERCONNECT FOR A SOLAR CELL

BACKGROUND OF THE INVENTION

The present invention relates to solar cells and in particular to solar cells having a conductive electrode pattern and bus bar interconnect which is applied to the solar cell in a single solder dipping procedure.

Photovoltaic devices such as silicon solar cells promise a viable alternative to non-replenishable fossil fuel energy generation. Light energy (photons) incident on a solar cell's surface must enter and be absorbed within the cell to be converted to an electrical current. The electrical current is carried by electrodes to bus bars which are attached to inter-connectors which join many cells together to form a solar panel. In the prior art, bus bars are sometimes directly attached to the solar cell by induction heating or other soldering means. Leads to the bus connections are also sometimes soldered directly upon the solar cell. This has the disadvantage of subjecting the solar cell to an additional heating step, and additional thermal stress. This can damage the solar cell. In contrast, the present invention attaches the bus bars by a solder dipping process and provides means for interconnecting cells without further subjecting cells to heat which can damage the solar cell. Possible cracking of the solar cell is prevented or greatly reduced. In the present invention the bus bars extend beyond the solar cell periphery and thus serve as inter-connectors to electrically connect the solar cells together, thus eliminating direct soldering upon the solar cell. In addition, the present invention also teaches a means of attaching the bus bars and making a pre-metallized grid conductive in a single solder dipping procedure.

DISCUSSION OF RELATED ART

The U.S. patents to J. Lebrun and J. Ikeda et al, U.S. Pat. Nos. 3,553,030 issued: Jan. 5, 1971; and 4,312,692 issued: Jan. 26, 1982, respectively, each teach the use of adhesives to secure electrical components to substrates prior to soldering. These patents generally teach overcoating the adhered component with solder. Large substrate surfaces are adhesively coated, which prevents the solder from running under the component by capillary action. Usually only the periphery of the component is directly secured to the substrate. This type of adherence does not provide strong mechanical and electrical connection.

By contrast, the present invention utilizes a high temperature, pressure-sensitive, double-stick adhesive, which is spot applied between bus bar and solar cell surface. This spot application provides a clearance, whereby solder will flow by capillary action between the underside of the bus bar and the solar cell surface. Practically the entire underside of the bus bar is mechanically and electrically connected to the solar cell surface, making for a very strong connection. The pressure-sensitive adhesive of the present invention also has the added advantage that it does not require a separate curing step to secure it in place, as taught by Ikeda.

The high temperature adhesive of the invention is resistant to attack by the molten solder bath, and the double-stick application provides an ease of attachment not taught in the related art.

SUMMARY OF THE INVENTION

The present invention includes a method for applying bus bars to a solar cell surface, including the steps of: spot attaching the bus bars to the solar cell, and solder dipping the solar cell with the attached bus bars, wherein the solder will flow between the bus bars and solar cell by capillary action. The spot attachment provides a clearance between the bus bars and solar cell surface for allowing the molten solder to flow therebetween. The bus bars are caused to have a stronger mechanical and electrical bond to the conductive surface of the solar cell by means of the solder bond between the bus bars and the solar cell surface.

On an upper surface of the cell, the conductive surface may comprise a grid. A pre-metallized grid pattern is made conductive by application of the solder, which also serves to simultaneously attach the bus bars to the solar cell. The bus bars can be spot attached to the solar cell by means of a double-stick adhesive material, in the preferred embodiment.

DETAILED DESCRIPTION OF THE INVENTION

The present invention discloses a solar cell with a unique electrode pattern and bus bar arrangement and a method of attaching the electrode pattern and bus bars to the solar cell in a one step operation enabling the interconnection of solar cells without reflowing the electrically conducting material (e.g. solder) that attaches the bus bars to the cell and forms the electrode of the cell.

Figure 2:
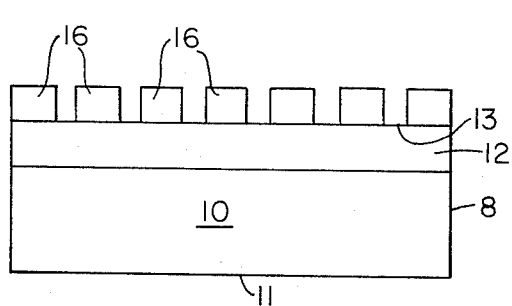
FIGS. 2 and 3 illustrate schematically, but not to scale, changes which take place in a portion of cross sectional views along line 3—3 of FIG. 1 of the solar cell during successive steps in the fabrication technique.

Referring first to FIG. 2, a silicon wafer 8 having a first type conductivity region 10 which may comprise P-type or N-type silicon, is diffused to form a region 12 of conductivity type opposite to that of region 10, forming a semiconductor junction, otherwise termed a P-N (or N-P) junction, in the region of the interface between regions 10 and 12. The diffusion and junction forming processes are well known in the art. Furthermore, the method of the present invention is operable for either N on P or P on N type cells.

Figure 1:
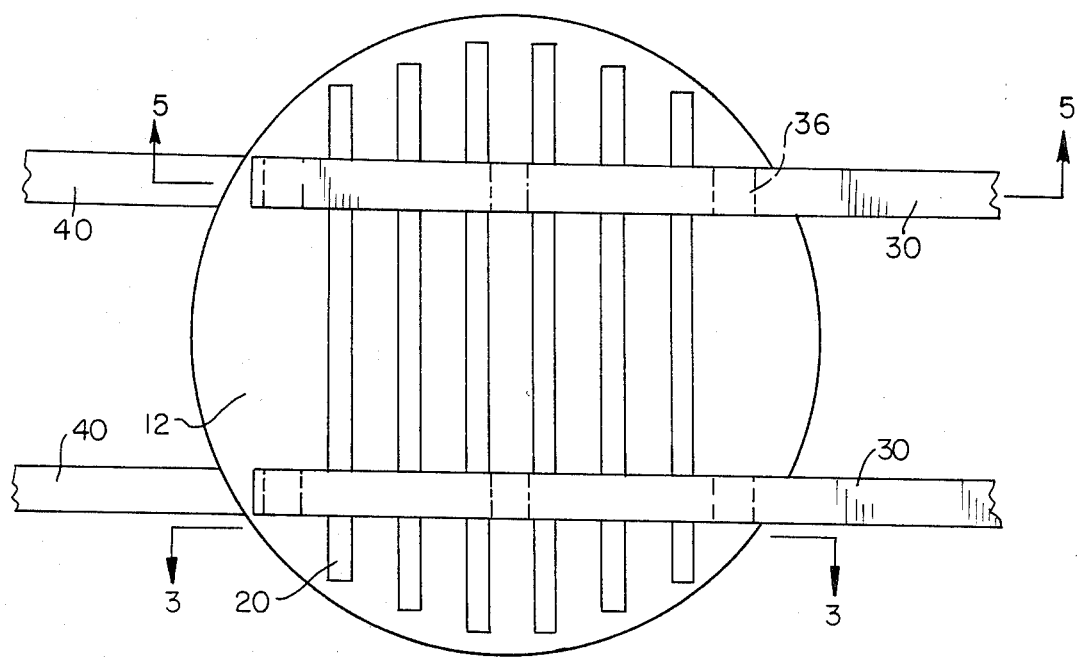
FIG. 1 shows a top view of a solar cell with bus bars attached according to the present invention.

Referring now to FIG. 1, upper surface electrode strips 20 forming a pattern are shown (six are schematically depicted) running at right angles to bus bars 30. The entire area that will be occupied by electrodes 20 and bus bars 30 is first made conductive and solderable by deposition of a suitable metal layer such as nickel, or other suitable solderable materials including silver and copper. Methods for deposition of such metal layers, which provide the primary electrical contact to the silicon, are well-known in the prior art.

Figure 3:
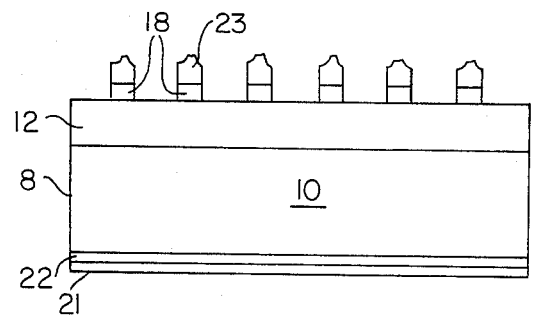

As an example, referring to FIGS. 2 and 3, a thin electrolessly deposited patterned layer 18 of nickel is deposited on the top surface 13 of region 12 while a substantially continuous layer 22 of nickel is deposited on the bottom surface 11 of region 10. Such a pattern may be formed in a conventional manner by, for example, making use of a complimentary pattern of photoresist material 16 (see FIG. 2) formed on surface 13 prior to the deposition of layer 18. These layers may be insufficiently conductive to serve as suitable current carrying electrodes for most solar cell applications. Accordingly, second conduction supportive electrode layers 23 and 21 comprising a relatively high electroconductivity metal may be formed by solder dipping, electroplating or the like. In a preferred embodiment, the upper surface area of the cell comprising at least the nickel electrode 18 is contacted with a solder flux agent and then with molten solder to form layer 23 comprising solder after the bus bars are fixed to the nickel layer 18.

Figure 5:
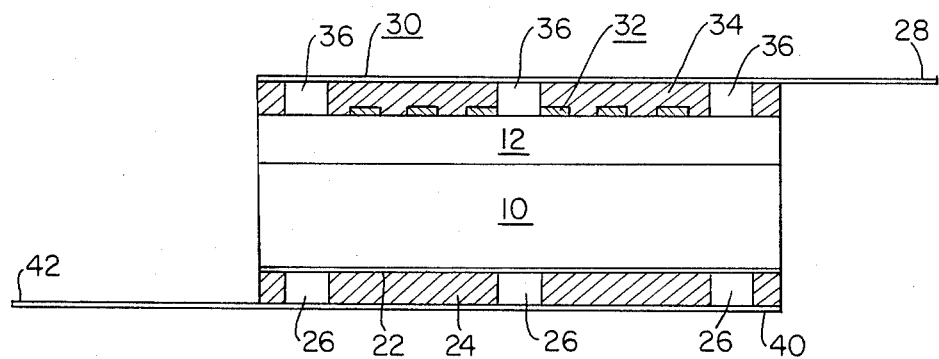
FIG. 5 shows an enlarged sectional view taken along lines 5—5 of FIG. 1, of a solar cell with bus bars attached according to the method of the present invention.

FIG. 5 shows a cross sectional view of part of the bus bar arrangement. Prior to the application of solder 23 to the cell as described above, the bus bars 30 are mechanically fixed to portions 32 of the upper wafer surface 13. In this fixed position, the bus bars 30 and the nickel plated pattern beneath the bus bars are parallel with a gap therebetween. The bus bar 30 is fixed to the nickel pattern by a means that has a high temperature resistance. The reason for high temperature resistance is the requirement that the bus bar be fixed to the nickel electrode pattern with an electrical connection at the same time that the electrode layer 23 is formed. The electrically conducting material is usually applied or formed at elevated temperatures. For example, if the electrically conductive material is solder 34 as in the preferred embodiment, the means for fixing the bus bars 30 to the portions 32 nickel electrode pattern must operate at about 200° C. The bus bars 30 may be of any suitable solderable material, although, preferred materials are copper or copper cladded invar.

A preferred method of fixing the bus bars 30 to the portions 32 of nickel electrode pattern is to tape the bars to the wafer surface with double faced pressure sensitive tape 36 capable of operating within the temperature range of 180° C. to 220° C. A tape of this type would include acrylic polymer adhesive tape. The tape 36 is applied with firm application pressure intermitently along the length of the bus bars 30. The bus bars 30 are then fixed to the upper surface 13 of wafer 8 by the tape 36. The cell may then be solder dipped so that solder 34 fills the space between the bus bars 30 and the nickel electrode pattern in addition to covering the remaining electrode pattern so that the solder 23 and 34 form an electrically continuous conductor. The space between the bus bars and upper surface 13 allows for capillary action for solder to fill the space. An example of a suitable acrylic tape is 3M brand A-10 ISOTAC Type Y-9469 acrylic adhesive tape. The tape covers only a small area of the surface 13 and remains with the cell as it is completed. The tape requires no curing and provides an elastic cushion which relieves internal stresses between bonded materials with different thermal expansion properties. A further consequence of using an acrylic adhesive is its added features of being a low out-gassing, practically inert, corrosive free polymer material inherently possessing long life stability and durability.

Referring now to FIGS. 3 and 5, an ohmic electrode and bus bars 40 are formed on the lower surface concurrent to the formation of layers 18 and 23 and bus bars 30. However, since the lower surface is not exposed to the incident sunlight, the nickel layer 22 may be a continuous layer totally covering the lower surface of region 10. The bus bars 40 are fixed to the nickel layer 22 similarly to those on the top of the cell. That is, the bus bars 40 are fixed to the nickel layer 22 by double faced acrylic polymer pressure tape 26 placed intermittently along its length. The surface of the nickel layer 22 is coated with an electrically conducting material 21 such as solder, and the space between the bus bars 40 and the nickel layer 22 is filled with similar material so that the solder layers form an electrically continuous layer 24.

Figure 4:
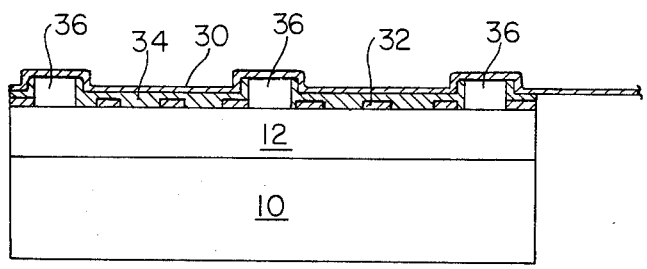
FIG. 4 shows an enlarged sectional side view of an alternative embodiment of a solar cell with bus bars attached according to the method of the present invention.

FIG. 4 shows an alternative embodiment of the bus bars 30 (only the upper bus bars are shown). Here the bars can be deformed around the tape to reduce the thickness of the solder deposit 34 which flows by capillary action between the bus bars 30 and the nickel electrode pattern. This reduced solder thickness will still provide a strong mechanical and electrical bond.

Figure 6:
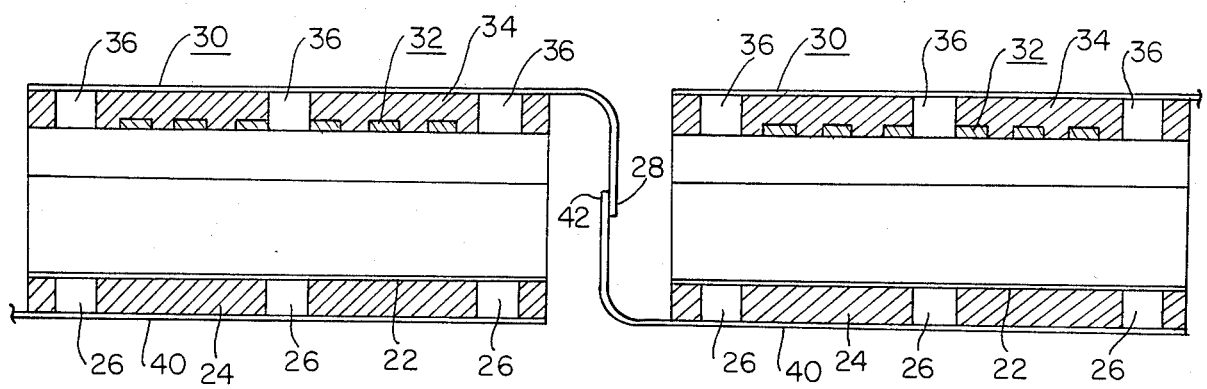
FIG. 6 shows an enlarged sectional side view of two solar cells interconnected together according to the present invention.

The bus bars 30 on the upper surface and bus bars 40 on the lower surface of the cell 8 extend beyond the edge of the cell a distance sufficient to serve as solar cell interconnects. These extensions 28 for the bus bar 30 and 42 for bus bar 40 serve as interconnects to electrically join one solar cell to adjacent solar cells (see FIG. 6) if more than one cell is used to form an array. Therefore end 28 of bus bar 30 may be joined to end 42 of bus bar 40 without causing a reflow of solder on the cells.

What is claimed is:

1. A solar cell assembly including:
    a solar cell having a surface with an electrically conductive pattern disposed thereon;
    at least one bus bar disposed adjacent to said conductive pattern; and
    means for attaching said bus bar to said solar cell including at least one segment of adhesive material disposed between said bus bar and said surface of said solar cell and a dip-soldered electrical and physical connection formed between said bus bar and said conductive pattern adjacent said adhesive material.

2. The solar cell assembly of claim 1, wherein a plurality of said adhesive segments are spaced along said surface of said solar cell.

3. A solar cell assembly comprising a solar cell having a conductive grid disposed on a surface thereof and at least one bus bar attached to said surface by means of an adhesive and solder combination, said combination comprising segments of adhesive between said bus bar and said surface and a dip-soldered electrical connection disposed between said bus bar and said grid adjacent said adhesive segments.

4. A solar cell assembly comprising spacedapart bus bars attached by adhesive to and fixed in electrical contact with a surface of a solar cell by means of dip-soldered portions, said solder being disposed beneath said bus bars for substantially the entire portion of said bus bars where said bus bars are in electrical contact with said solar cell.

5. The solar cell assembly of claim 4, wherein said bus bars are additionally attached to said solar cell by adhesive segments.

6. A method of attaching a bus bar to a surface of a solar cell, comprising the steps of:

(a) ahdesively spot attaching said bus bar to a premetallized solar cell; and (b) solder dipping said pre-metallized solar cell with said adhesively attached bus bar, whereby said solder will flow between said bus bar and said pre-metallized solar cell by capillary action.

7. The method of claim 6, wherein adhesive is used to spot attach said bus bar to a correspondingly shaped conductor disposed on said solar cell.

8. A method of attaching bus bars to a surface of a pre-metallized solar cell comprising the step of applying adhesive to portions of said bus bars and said cell for adhesively attaching said bus bars to said cell, which bus bars being previously are then fixed upon said pre-metallized solar cell by dip-soldering.

9. The method of claim 8, wherein said adhesive is an acrylic polymer.

10. The method of claim 8, wherein said bus bars extend beyond the edge of said solar cell a distance sufficient to serve as solar cell interconnects.

11. A method of fabricating a solar cell assembly comprising the step of:

(a) fixing bus bars to surfaces of a solar cell by solder dipping said solar cell in a solder bath with said bus bars being previously attached thereto by adhesive segments, each of said bus bars extending beyond said solar cell in order to interconnect with other solar cells.

* * * * *